(12) United States Patent
Kim et al.

(10) Patent No.: US 8,900,468 B2
(45) Date of Patent: Dec. 2, 2014

(54) METHODS OF FORMING A PATTERN

(71) Applicant: Samsung Electronics Co., Ltd., Suwon-Si, Gyeonggi-Do (KR)

(72) Inventors: Eun-Sung Kim, Seoul (KR); Jae-Woo Nam, Seoul (KR); Chul-Ho Shin, Yongin-si (KR); Shi-Yong Yi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/905,662

(22) Filed: May 30, 2013

(65) Prior Publication Data

US 2014/0061154 A1 Mar. 6, 2014

(30) Foreign Application Priority Data

Sep. 4, 2012 (KR) ........................ 10-2012-0097582

(51) Int. Cl.
*C03C 25/68* (2006.01)
*G03F 7/00* (2006.01)

(52) U.S. Cl.
CPC .................................. *G03F 7/0035* (2013.01)
USPC .................... 216/46; 216/49; 216/72; 216/79; 438/725

(58) Field of Classification Search
CPC ............... G03F 7/004; B81C 1/00396; B81C 2201/0132; B81C 1/00404; H01L 21/0273
USPC ............................ 216/46, 49, 72, 79; 438/725
See application file for complete search history.

(56) References Cited

U.S. PATENT DOCUMENTS

| 7,923,280 | B2 | 4/2011 | Koelmel et al. | |
| 8,053,368 | B2 | 11/2011 | Burns et al. | |
| 2009/0263628 | A1* | 10/2009 | Millward | 428/173 |
| 2009/0308837 | A1* | 12/2009 | Albrecht et al. | 216/22 |
| 2011/0147985 | A1* | 6/2011 | Cheng et al. | 264/225 |
| 2013/0210226 | A1* | 8/2013 | Seino | 438/666 |

FOREIGN PATENT DOCUMENTS

| KR | 20100000623 A | 1/2010 |
| KR | 20100123724 A | 11/2010 |
| KR | 10-1076777 B1 | 4/2011 |
| KR | 20110077484 A | 7/2011 |

* cited by examiner

*Primary Examiner* — Binh X Tran
(74) *Attorney, Agent, or Firm* — Harness, Dickey & Pierce, P.L.C.

(57) ABSTRACT

A method includes forming a hydrophilic guide layer, a DBARC layer and a photoresist film. A portion of the photoresist film and DBARC layer is exposed to form exposed and unexposed portions. The unexposed photoresist film is removed to form a photoresist pattern including the exposed photoresist film portion. A neutral layer is formed on the photoresist pattern. The photoresist pattern and the DBARC layer of the exposed portion are removed to form first opening portions exposing the guide layer. A block copolymer layer includes a block copolymer having first and second polymer blocks coated on the neutral layer while filling the first opening portions. The block copolymer layer is microphase separated to form a pattern layer including first and second patterns. A pattern including one polymer block is removed to form a pattern mask. The object layer is etched to form a pattern including second opening portions.

20 Claims, 17 Drawing Sheets

METHODS OF FORMING A PATTERN

CROSS-REFERENCE TO RELATED APPLICATION

This application claims priority under 35 USC §119 to Korean Patent Application No. 10-2012-0097582 filed on Sep. 4, 2012 in the Korean Intellectual Property Office (KIPO), the entire disclosure of which is incorporated herein by reference.

BACKGROUND

1. Field

Example embodiments relate to methods of forming a pattern. More particularly, example embodiments relate to methods of forming a pattern including opening portions having a minute or reduced inner width.

2. Description of the Related Art

As semiconductor devices have been highly integrated, contact holes having a minute or reduced inner width and minute or reduced patterns having a critical dimension may be required. In order to form the minute or reduced contact holes and the minute or reduced patterns, research on decreasing the wavelength of a light source used in an exposing process and on increasing an effective aperture of a lens have been conducted. Differently, a method of forming minute or reduced contact holes and minute or reduced patterns by using a directed self-assembly (DSA) phenomenon of molecules has been studied.

SUMMARY

Example embodiments provide a method of forming a pattern including opening portions having a minute or reduced inner width and overcoming the limits of an exposing process.

According to example embodiments, a method of forming a pattern may include forming a hydrophilic guide layer on a substrate including an object layer formed thereon, forming a developable bottom anti-reflective coating (DBARC) layer and a photoresist film on the guide layer, exposing a portion of the photoresist film and the underlying DBARC layer to form an exposed portion and an unexposed portion in the photoresist film and the DBARC layer, respectively, forming a photoresist pattern including the exposed portion of the photoresist film by removing the photoresist film of the unexposed portion, forming a neutral layer on a surface of the photoresist pattern and the unexposed portion of the DBARC layer, removing the photoresist pattern, the neutral layer on a surface of the photoresist pattern, and the exposed portion of the DBARC layer to form a neutral layer pattern and first opening portions exposing a surface of the hydrophilic guide layer, forming a block copolymer layer on the neutral layer pattern and filling the first opening portions, the block copolymer layer including a block copolymer having a first polymer block and a second polymer block, forming a pattern layer including first patterns and second patterns by microphase separating the block copolymer layer, each of the first patterns and each of the second patterns being repeatedly disposed, the first patterns including the first polymer block in the first opening portions and on the neutral layer, the second patterns including the second polymer block and surrounding sidewalls of the first patterns, forming a pattern mask by removing one of the first and second patterns including at least one of the first and second polymer blocks from the pattern layer, and forming a pattern by etching the object layer using the pattern mask, the pattern including second opening portions.

The hydrophilic guide layer may be a silicon oxynitride layer. Removing the photoresist pattern, the neutral layer on a surface of the photoresist pattern, and the exposed portion of the DBARC layer may form a guide pattern having an upper surface with a circular shape. Forming the pattern layer including first patterns and second patterns by microphase separating the block copolymer layer may include annealing the block copolymer layer at a temperature higher than a glass transition temperature of the block copolymer, and forming the first patterns to be in contact with the guide layer exposed through the first opening portions, wherein each of the first patterns and each of the second patterns may be repeatedly formed in the first opening portions and on the neutral layer pattern, respectively, by being directed by the first patterns making contact with the exposed guide layer.

An inner width of the first opening portions may be greater than an inner width of the second opening portions, and an interval between the first opening portions may be greater than or equal to the inner width of the first opening portions. The first opening portions may have a contact hole shape and the first patterns may have a pillar shape, and the first patterns may be formed regularly.

The first polymer block may be hydrophilic, the second polymer block may include a hydrophobic material, a volume fraction of the first polymer block in the block copolymer layer may be about 20 to about 40%, and a volume fraction of the second polymer block in the block copolymer layer may be about 60 to about 80%. The pattern mask may be formed by removing the first patterns including the first polymer block. The block copolymer layer may include a polystyrene-polymethyl methacrylate block copolymer (PS-b-PMMA).

The photoresist film may be a positive photoresist film, and the method may further include removing the unexposed portion of the photoresist film using a negative tone developer. The photoresist pattern, the neutral layer on a surface of the photoresist pattern, and the exposed portion of the DBARC layer may be removed using a tetramethyl ammonium hydroxide (TMAH) developer. The photoresist film may be a negative photoresist film, and the method may further include removing the unexposed portion of the photoresist film using a TMAH developer.

The photoresist pattern and the DBARC layer of the exposed portion may be removed using a thinner composition for stripping of a photoresist material. The first opening portions may have a line shape, and the first patterns and the second patterns may have a line shape and may be alternately and regularly formed. The first polymer block may be hydrophilic, the second polymer block may include a hydrophobic material, a volume fraction of the first polymer block in the block copolymer layer may be about 45 to about 55%, and a volume fraction of the second polymer block in the block copolymer layer may be about 45 to about 55%.

According to example embodiments, a method may include forming a guide layer on a substrate including an object layer formed thereon, forming a photoresist pattern on the guide layer, removing the photoresist pattern to form first opening portions exposing a surface of the guide layer, forming a block copolymer layer filling the first opening portions, the block copolymer layer including a block copolymer having a first polymer block and a second polymer block, and forming a pattern layer including first patterns and second patterns by microphase separating the block copolymer layer, each of the first patterns and each of the second patterns being repeatedly disposed, the first patterns including the first polymer block in the first opening portions, the second patterns including the second polymer block surrounding sidewalls of the first patterns.

The method may further include forming a pattern mask by removing one of the first and second patterns including at least one of the first and second polymer blocks from the pattern layer, and forming a pattern by etching the object layer using the pattern mask, the pattern including second opening portions. The guide layer may be a silicon oxynitride layer. The photoresist pattern may be removed to form a guide pattern having an upper surface with a circular shape. The block copolymer layer may include forming a polystyrene-polymethyl methacrylate block copolymer (PS-b-PMMA).

According to example embodiments, a contact hole and a line pattern having a minute or reduced width may be formed. In addition, a guide layer for forming the contact hole and the line pattern may have a hydrophilic property, and a material for forming the guide layer may be affordable and the deposition of the material may be easily conducted. The guide layer may comprise an appropriate material in a semiconductor manufacturing process. The contact hole and the line pattern may be formed through a simple process.

BRIEF DESCRIPTION OF THE DRAWINGS

Example embodiments will be more clearly understood from the following detailed description taken in conjunction with the accompanying drawings. FIGS. 1A to 6C represent non-limiting, example embodiments as described herein.

FIGS. 1A to 1I are cross-sectional views for explaining a method of forming a contact hole in accordance with example embodiments;

FIGS. 6A to 6C are perspective views for explaining a method of forming a line pattern in accordance with example embodiments.

DETAILED DESCRIPTION OF EMBODIMENTS

Figure 1A:
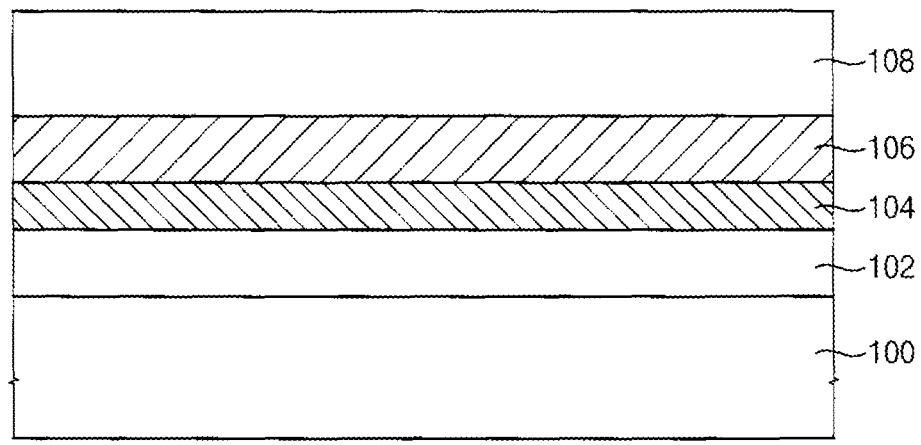

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In example embodiments, pattern density may be increased by controlling the pitch of a contact hole using a material having a self-assembling behavior for forming a minute or reduced contact hole. Particularly, when using a phase separation phenomenon of a block copolymer, repeatedly arranged minute or reduced structures may be obtained through a spontaneous self-assembly. Different from a photolithography process, the size of a minute or reduced pattern or a minute or reduced contact hole formed by using the self-assembling characteristic of the block copolymer may be almost the same as the thickness of a single molecular layer. Accordingly, a minute or reduced pattern and a minute or reduced contact hole exceeding the limit of the resolution of a common photolithography process may be obtained.

A block copolymer is a functional polymer having a combined polymer structure of two or more kinds of polymer blocks having different structures through a covalent bond. Each of the polymer blocks constituting the block copolymer may have a different mixing property and a selective solubility according to the chemical structure of each block. The block copolymer may form a self-assembled structure by a microphase separation or a selective dissolution in a liquid phase or a solid phase.

The formation of a minute or reduced structure having a specific shape through the self-assembly of the block copolymer may be affected by the physical/chemical property of the block polymer. Particularly, when a diblock copolymer including two different polymers are self-assembled on a bulk substrate, the volume fraction of each polymer block constituting the block copolymer may be primarily affected by the molecular weight of each polymer block.

The self-assembled structure of the block copolymer may be one of various structures (e.g., a cylinder phase structure and a lamellar structure) according to the volume fraction of each polymer block constituting the block copolymer, the temperature, the size of the molecule, and/or the molecular weight. In example embodiments, the size of each of the polymer blocks in each structure may be proportional to the molecular weight of the corresponding polymer block.

The self-assembled block copolymer in the cylinder phase structure and the lamellar structure may be used for forming the minute or reduced pattern of a semiconductor device. When the cylinder phase structure is used, cylindrical pillars having a circular or a hexagonal shape in the plan view may be formed. Therefore, the orientation of the obtained structure may be relatively simple, and a plurality of hole pattern structures repeatedly arranged along the orientation direction of the pillars may be formed. The lamellar structure may be obtained by repeatedly overlapping two-dimensional lamellar structures. When the block copolymer having the lamellar structure is oriented on the surface of a substrate in a vertical direction, line and space patterns having a relatively large aspect ratio may be formed.

The self-assembled structure of the block copolymer may form a minute or reduced self-assembled structure having a few nm to a few tens of nm in proportion to the molecular size of the polymer. Forming the self-assembled structure of the block copolymer may not require a highly expensive apparatus necessary in a processing technique (e.g., a common photolithography process) and may use a spontaneous thermodynamic process to largely decrease the number of the processes and to simplify a pattern forming process. In addition, because minute or reduced patterns may be formed by using the self-assembling property of a block copolymer, minute or reduced patterns having a few nm to a few tens of nm degree may be formed by a common processing technique. Thus, a diverse application in a future electronic device field may be expected.

In order to utilize the self-assembling property of the block copolymer in forming a minute or reduced pattern necessary for manufacturing a semiconductor device, a material layer including the block copolymer may be formed as a thin film on a specific planar layer on a substrate. The material layer may be heated to a temperature higher than the glass transition temperature of the block copolymer to induce the self-assembly. In example embodiments, the orientation of the obtained minute or reduced structure may be controlled from the self-assembly of the copolymer. Because the self-assembling phenomenon of a polymer is a spontaneous process of molecules intending to be present at a thermodynamically stable state, the orientation of the thus formed self-assembled structure may be controlled in a previously designed shape. In order to induce the orientation of the polymer blocks during the self-assembly, a guide layer or a guide pattern may be necessary on the substrate.

Hereinafter, example embodiments on the method of forming a minute or reduced contact hole through forming the self-assembled structure will be described in detail with reference to the accompanying drawings. However, the present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, various elements and regions are schematic and so, the relative sizes or distances of the present inventive concepts may not be limited thereto.

FIGS. 1A to 1I are cross-sectional views for explaining a method of forming contact holes in accordance with example embodiments. FIGS. 2A to 2E are plan views for explaining a method of forming contact holes in accordance with example embodiments.

Figure 1B:
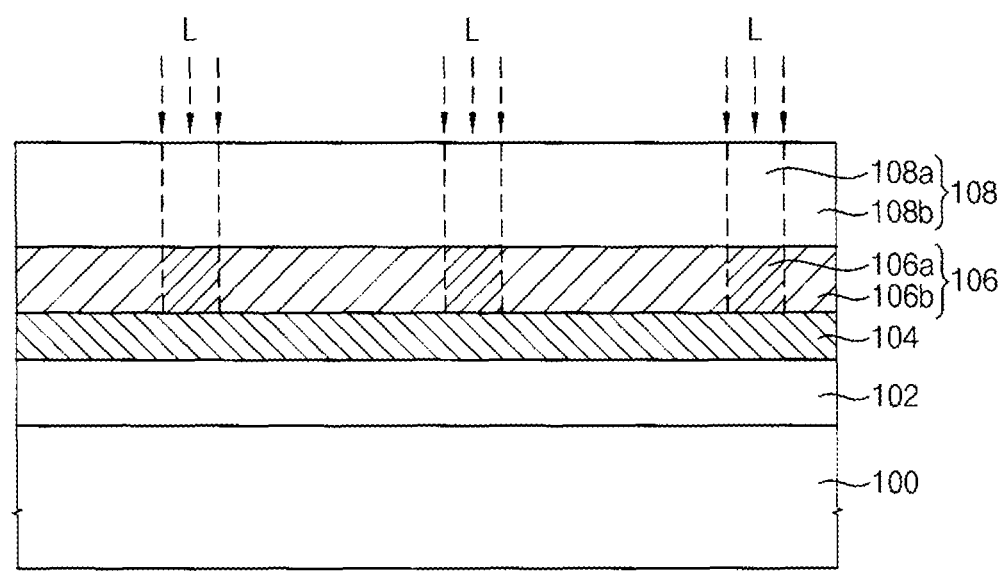
Figure 1C:
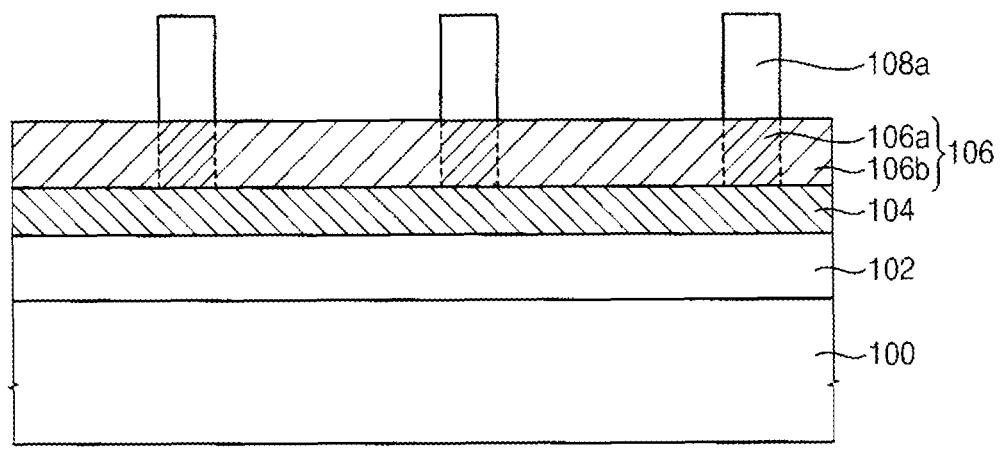
Figure 1D:
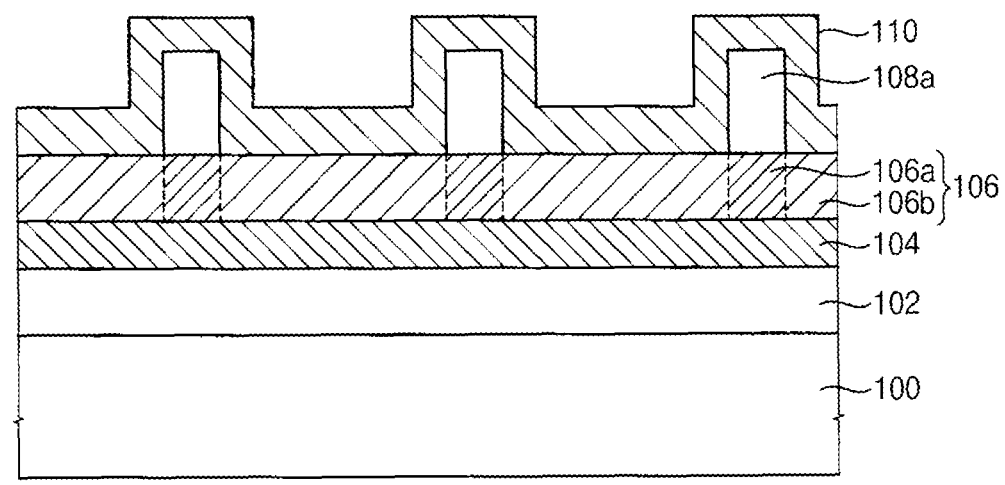
Figure 1E:
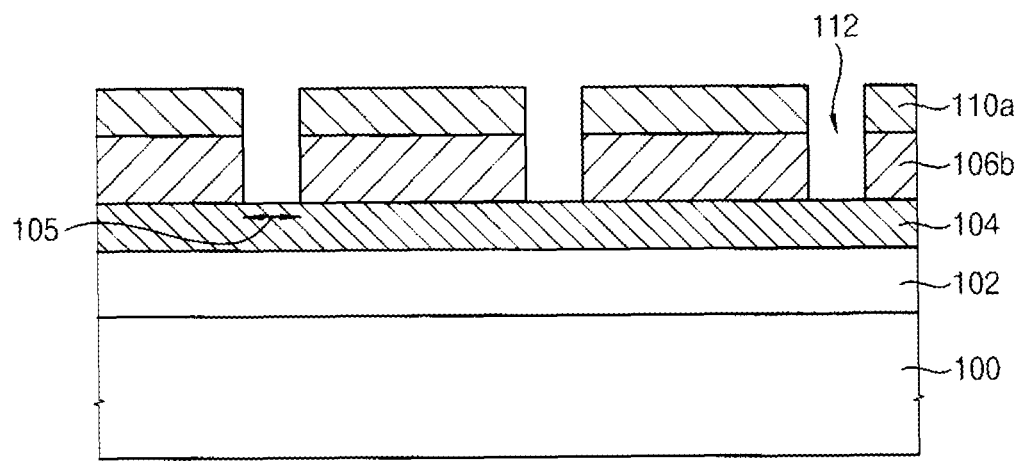
Figure 1F:
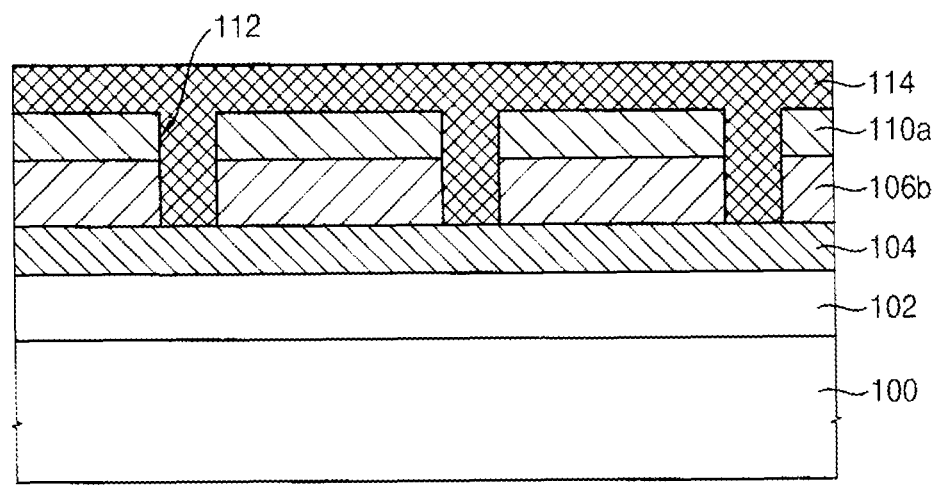
Figure 1G:
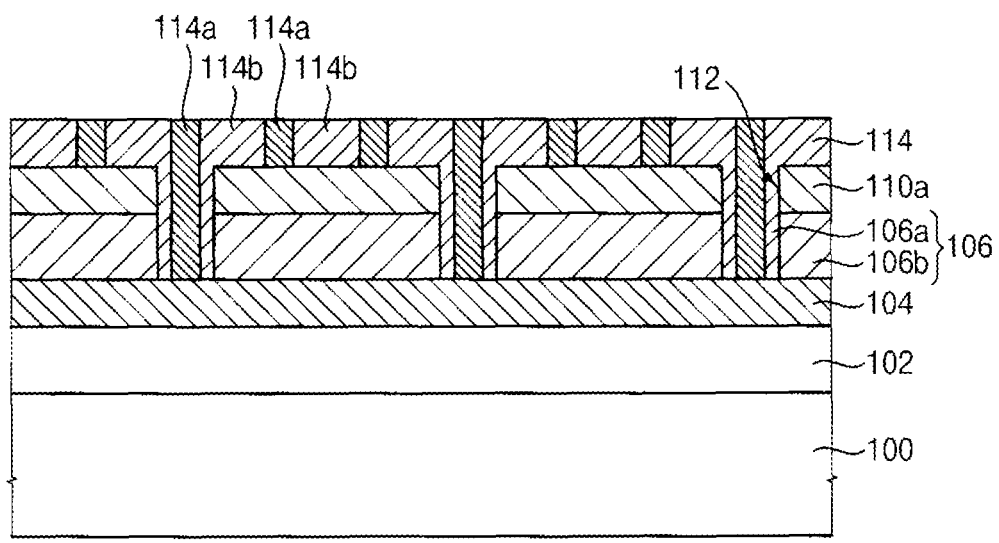
Figure 1H:
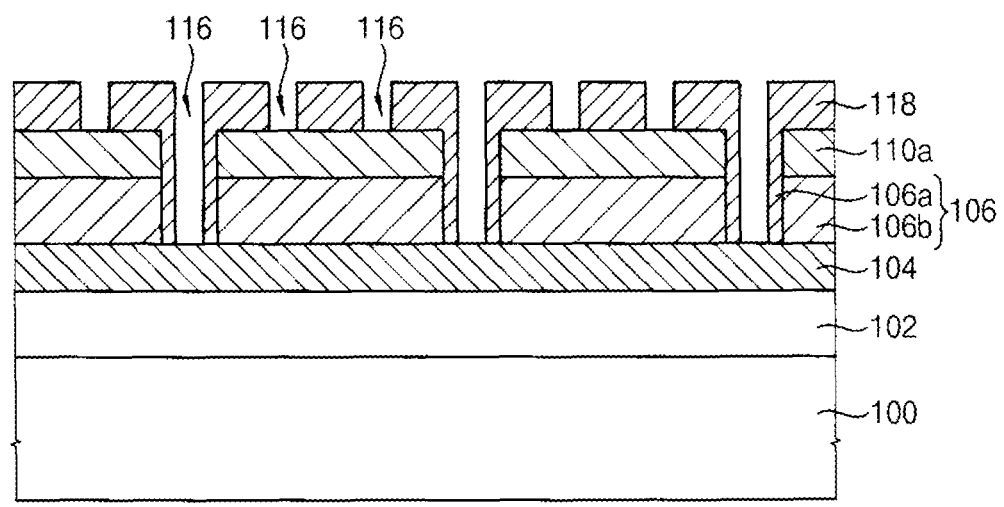
Figure 1I:
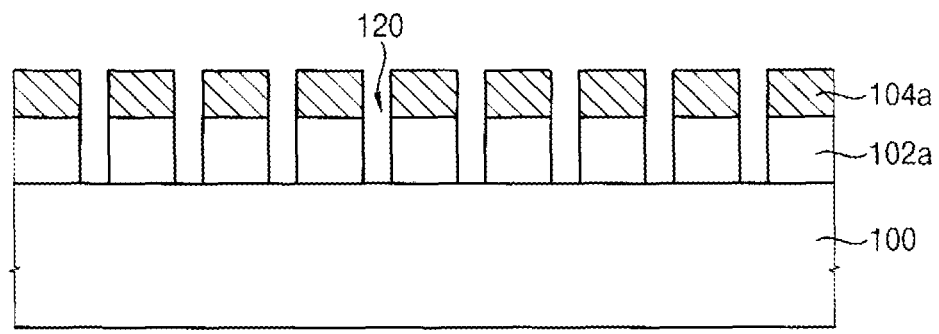
Figure 2A:
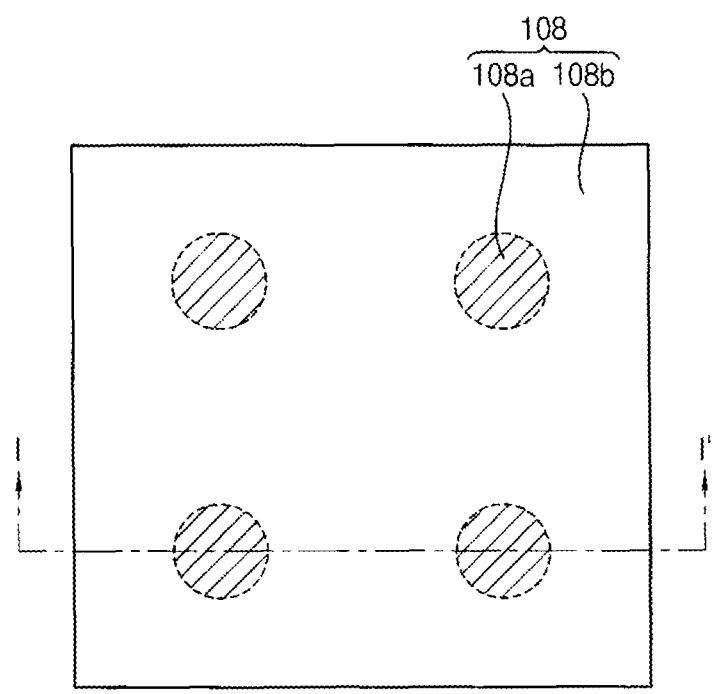
FIGS. 2A to 2E are plan views for explaining a method of forming a contact hole in accordance with example embodiments.

FIGS. 1A to 1I are cross-sectional views taken along a line I-I' in FIG. 2A.

Referring to FIG. 1A, an object layer 102 to be etched may be formed on a substrate 100. The object layer 102 to be etched may be an insulating layer. Particularly, the object layer 102 to be etched may include an oxide layer, a nitride layer, and/or an oxynitride layer. When an etching process is conducted on the substrate 100, the formation of the object layer 102 to be etched may be omitted.

On the object layer 102 to be etched, a guide layer 104 may be formed. The guide layer 104 may be required to have a relatively high strength, a relatively high hydrophilicity, a relatively high heat-resistance, and a relatively low solubility or insolubility with respect to a solvent possibly dissolving a block copolymer. In addition, the property and the shape of the guide layer may be required to be maintained by heat treatments conducted in following processes. The guide layer may be formed using an affordable material and a material to be deposited more easily in a semiconductor manufacturing process. Considering the conditions, a silicon oxynitride (SiON) layer may be included as the guide layer 104.

The silicon oxynitride layer is relatively strongly hydrophilic and so, may be appropriately used as the guide layer 104. In addition, because the silicon oxynitride layer is a commonly used layer for the manufacture of a semiconductor device, the acquisition and deposition of the material may be more easily conducted. The silicon oxynitride layer may be formed by a chemical vapor deposition.

On the guide layer 104, a developable bottom anti-reflective coating (DBARC) layer 106 may be formed. The DBARC layer 106 may be formed by a spin coating process. The DBARC layer 106 may prevent or reduce the reflection from a bottom portion while performing an exposing process with respect to a photoresist film in a following process. The DBARC layer 106 may include a polymer including a chromophore group, a cross-linker for making a cross-linking bond with the polymer, a PAG, a thermal-acid generator (TAG) and a solvent.

In example embodiments, an anti-reflective layer formed on the guide layer 104 may be selectively removed by a developer. Thus, the DBARC layer 106 may be used as the anti-reflective layer. Meanwhile, an organic anti-reflective layer may not be selectively removed. Therefore, the organic anti-reflective layer may not be used on the guide layer 104 in accordance with example embodiments.

After that, a positive photoresist film 108 may be formed on the DBARC layer 106. The photoresist included in the positive photoresist film 108 may include a resist for a KrF excimer laser (248 nm), a resist for an ArF excimer laser (193 nm), a resist for an F2 excimer laser (157 nm) or a resist for an extreme ultraviolet (EUV, 13.5 nm).

Referring to FIGS. 1B and 2A, portions of the positive photoresist film 108 to be formed as a photoresist pattern may be exposed. The portions to be formed as the photoresist pattern may be on an upper portion of portions to be formed as a guide pattern.

The positive photoresist film 108 corresponding to the upper portion of the portion to be formed as the guide pattern may be exposed by using an exposing mask (not illustrated). The exposing mask may include a shield layer having, for example, a circular exposing portion, on a quartz substrate. The shield layer may be formed by using chrome.

By the light L passed through the exposing mask, the positive photoresist film 108 may be divided into an exposed portion 108a and an unexposed portion 108b. In the exposed portion 108a, an acid may be generated by the exposure, and in the unexposed portion 108b, the acid may not be generated. The light used for the exposure may be selected according to the positive photoresist film 108 used. Particularly, the light used for the exposure may include a KrF excimer laser (248 nm), an ArF excimer laser (193 nm), an F2 excimer laser (157 nm) or a EUV (13.5 nm).

In following processes, the exposed portion of the guide layer 104 may be provided as a guide pattern for forming a contact hole. The upper surface of the guide pattern may have a circular shape as the bottom portion of the contact hole to be formed. Accordingly, the exposed portion 108a of the positive photoresist film may have a circular shape. In addition, the exposed portions 108a of the positive photoresist film may be repeatedly disposed to an array shape by a first distance in an X-direction and by a second distance in a Y-direction. The first distance and the second distance may be the same or different.

The inner width (i.e., the diameter) of the exposed portion 108a may be greater than the inner width of a contact hole to be finally formed. In addition, the first distance and the second distance between the exposed portions may be the same as the inner width of the exposed portion or may be greater than the inner width of the exposed portion.

The light L exposed during the exposing process may be transferred to the DBARC layer 106 disposed under the positive photoresist film 108 as well as the positive photoresist film 108. Accordingly, the DBARC layer 106 disposed under the exposed portion 108a of the positive photoresist film may be also exposed, and the DBARC layer 106a may also be divided into an exposed portion 106a and an unexposed portion 106b. The exposed portion 106a and the unexposed portion 106b in the DBARC layer 106 may have a different solubility to each other The DBARC layer 106 and the positive photoresist film 108 may have an improved adhesiveness. Thus, an additional adhesion layer may not be necessary on the DBARC layer 106 to increase the adhesiveness of the positive photoresist film. That is, the additional adhesive layer (e.g., hexamethyldisilazane (HMDS)) may not be formed on the DBARC layer 106 or on the guide layer 104.

Figure 2B:
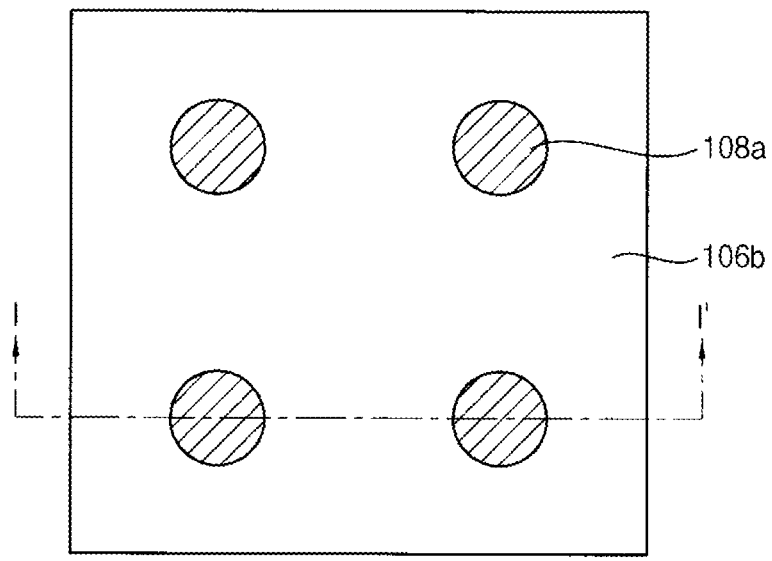

Referring to FIGS. 1C and 2B, the unexposed portion 108b of the positive photoresist film 108 may be removed to form a photoresist pattern 108a constituted by only the exposed portion 108a.

In order to remove the unexposed portion 108b of the positive photoresist film, an organic solvent of a negative tone developer (NTD) may be used. The organic solvent of a negative tone developer may be different from a common developer of a positive tone developer and may be a non polar solvent. Examples of the NTD may include at least one of an ether organic solvent, an acetate organic solvent, a propionate organic solvent, a butyrate organic solvent, a lactate organic solvent and a mixture thereof. For example, the NTD may include n-butyl acetate.

Because the upper surface of the exposed portion has a circular shape, the photoresist pattern 108a may have a pillar shape. As illustrated in FIG. 2B, the photoresist pattern 108a may be disposed with a first distance in an X-axis direction and with a second distance in a Y-axis direction so as to have an array shape. The diameter of the upper surface of the photoresist pattern 108a may be accomplished within the resolution limit of a common photolithography process. The photoresist pattern 108a may be baked at a temperature of 200° C. to 250° C. to cure the photoresist pattern 108a.

Referring to FIG. 1D, a neutral layer 110 may be formed on the outer surface of the photoresist pattern 108a and on the upper surface of the exposed DBARC layer 106b. The neutral layer 110 may be formed by using a material having the same affinity with respect to each block included in a subsequently formed block copolymer. The neutral layer 110 may be formed by, for example, a random polymer.

When the block copolymer used in a following process includes polystyrene (PS)-polymethyl methacrylate (PMMA) block copolymer (PS-b-PMMA), the neutral layer 110 may use the thin film of a cross-linkable random PS:PMMA copolymer (PS-γ-PMMA) by a light, which may have the same affinity with respect to the PS and the PMMA and a neutral wetting property. The neutral layer 110 may be formed through a spin coating process.

The thickness of the neutral layer 110 on the exposed surface of the DBARC layer 106b may be relatively large, while the thickness of the neutral layer 110 formed on the outer surface of the photoresist pattern 108a extruded as a pillar shape may be relatively small.

With reference to the thickness of the neutral layer 110 formed on the upper surface of the DBARC layer 106b, when the thickness of the neutral layer 110 is smaller than 50 Å, the neutral layer 110 may be formed non uniformly. When the thickness of the neutral layer 110 is greater than 200 Å, the penetration of a developer may become difficult, and the removal of the photoresist pattern 108a in a following process may become difficult. Thus, the neutral layer 110 may be formed to a thickness of 50 Å to 200 Å.

Figure 2C:
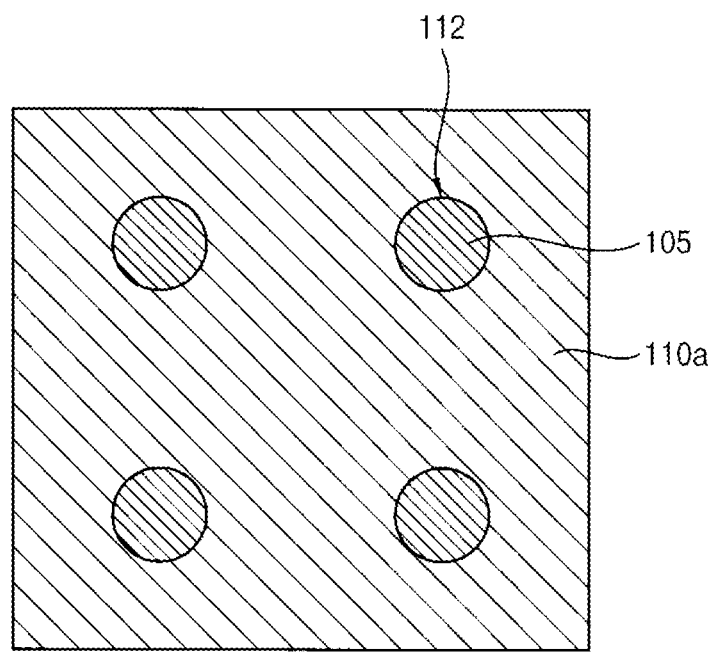

Referring to FIGS. 1E and 2C, the substrate including the neutral layer 110 formed thereon may be developed by using a developer to remove the photoresist pattern 108a and the exposed portion 106a of the DBARC layer disposed under the photoresist pattern 108a. The developer may be an aqueous alkaline solution, for example, an aqueous solution of tetramethyl ammonium hydroxide (TMAH). The concentration of the aqueous TMAH solution may be, for example, about 2 to about 5 wt %.

When the developer penetrates into the neutral layer 110, all the photoresist pattern 108a of the positive photoresist in the exposed portion may be removed, and only the exposed portion 106a in the DBARC layer 106 may be removed. Accordingly, on the guide layer 104 disposed between the photoresist patterns 108a, the DBARC pattern 106b may be formed. In addition, through the removal of the photoresist pattern 108a and the exposed portion 106a of the DBARC layer, the neutral layer 110 positioned on the upper surface and the sidewall of the photoresist pattern 108a may be lifted-off and removed. Then, only the neutral layer formed on the DBARC pattern 106b may remain to form a neutral layer pattern 110a.

Because the photoresist pattern 108a have a pillar shape, a first opening portions 112 having a contact hole shape may be formed at the removed portion of the photoresist pattern 108a and the underlying DBARC layer 106. As illustrated in FIG. 1E, the opening portions 112 may be repeatedly arranged in an X-axis direction and a Y-axis direction. The inner width of the first opening portions 112 may be greater than the inner width of second opening portions to be finally formed. In addition, a first distance and a second distance between the first opening portions 112 may be the same as the inner width of the first opening portion 112 or greater than the inner width of the first opening portion.

Through the bottom surface of the first opening portion 112, the guide layer 104 may be exposed. The exposed portion of the guide layer 104 may be provided as a guide pattern 105 while forming a pattern using a phase separation phenomenon of a block copolymer in a following process. That is, the guide layer 104 may not be etched directly, but a portion of the guide layer 104 may be exposed to the external environment to function as the guide pattern 105.

Referring to FIG. 1F, a block copolymer layer 114 may be formed on a structure including the first opening portion 112 and the neutral layer pattern 110a.

In order to form the block copolymer layer 114, a block copolymer may be dissolved in a solvent and then may be spin coated. The solvent may include, for example, toluene. Most of the solvent may be evaporated after conducting the coating. The block copolymer layer 114 may be formed on the neutral layer pattern 110a while filling up the first opening portion 112.

The block copolymer included in the block copolymer layer 114 may be a diblock copolymer including two polymer blocks (will be called as first and second polymer blocks, hereinafter). The first and second polymer blocks may have a different mixing property, a different wetting property, a different selective solubility and a different polarity because of the difference in the chemical structure of the repeated unit of each polymer. In example embodiments, the first polymer block may be relatively hydrophilic, and the second polymer block may be relatively hydrophobic.

According to the volume fraction of the first and second polymer blocks included in the block copolymer, the pattern shape formed in a following process may become different. In example embodiments, contact holes may be formed in a following process and so, the first and second polymers may have the volume fraction to have a cylindrical structure through a microphase separation. To satisfy the condition, the block copolymer may include the first polymer block by the volume fraction of about 20 to about 40% and the second polymer block by the volume fraction of about 60 to about 80%. For example, the volume fraction of the first polymer block may be about 30 to about 35%, and the volume fraction of the second polymer may be about 65 to about 70%.

The block copolymer used in example embodiments may include a polystyrene (PS)-polymethyl methacrylate (PMMA) block copolymer. The first polymer block may be hydrophilic PMMA, and the second polymer block may be hydrophobic PS. Accordingly, the PS domain may have the volume fraction of about 60 to about 80% and the PMMA domain may have the volume fraction of about 20 to about 45% in the PS-b-PMMA.

Another example of the block copolymer may include polyethylene oxide-polyisoprene, polyethylene oxide-polybutadiene, polyethylene oxide-polystyrene, polyethylene oxide-polymethyl methacrylate, polystyrene-polyvinyl pyridine, polystyrene-polyisoprene (PS-b-PI), polystyrene-polybutadiene, polybutadiene-polyvinyl pyridine, polyisoprene-polymethyl methacrylate and/or polystyrene-polylactide. In addition, the block copolymer may be a triblock copolymer or a multiblock copolymer including three or more polymer blocks. The triblock copolymer may include poly(styrene-blockmethyl methacrylate-block-ethylene oxide).

Figure 2D:
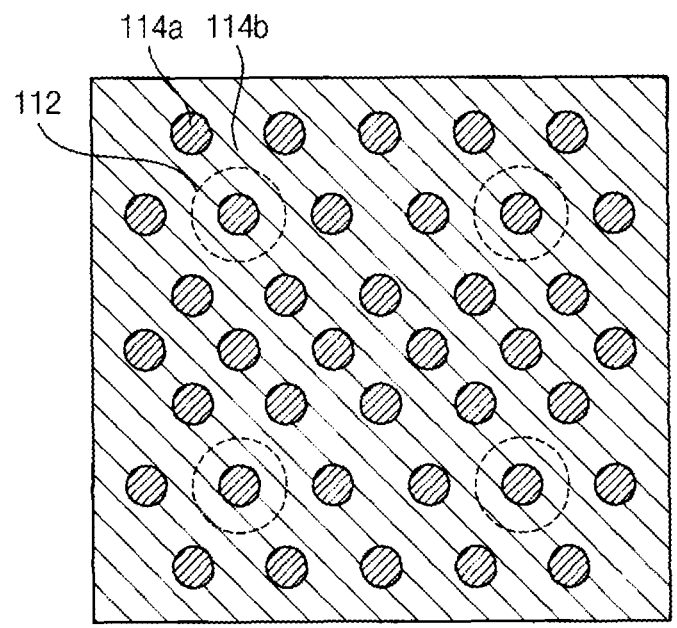

Referring to FIGS. 1G and 2D, the components in the block copolymer 114 may be rearranged through the phase separation of the block copolymer layer 114 to form minute or reduced pattern layers 114a and 114b including the pillar shape pattern.

Because the guide pattern 105 and the exposed portion of the guide layer 104 may be hydrophilic, the adhesiveness of the guide pattern 105 with the first polymer block, PMMA, may be improved. Accordingly, the first polymer block may be addressed by the guide pattern 105 to form a first pattern 114a having a pillar shape. In addition, the second polymer block PS may be self-assembled to form a thin layer 114b surrounding the addressed first polymer block. Then, the first polymer blocks may be arranged while having the shape of the first pattern 114a of the pillar shape, and the second polymer block may be self-assembled to form the thin layer 114b surrounding the first pattern 114a. As illustrated in FIG. 1G, minute or reduced pattern layers 114a and 114b including the first pattern 114a including the PMMA and having the pillar shape, and the thin layer 114b including the PS surrounding the pillar shape pattern may be formed. As described above, the first polymer block having the pillar shape may be arranged on the guide pattern 105 to form first patterns 114a having the pillar shape and a relatively narrow diameter.

As described above, in order to rearrange the components in the block copolymer by phase separating the block copolymer layer 114, the block copolymer layer 114 may be annealed at a temperature higher than the glass transition temperature of the block copolymer in the block copolymer layer 114. Particularly, in order to phase separate the block copolymer layer 114, the block copolymer layer 114 may be annealed at a temperature selected from the range of about 100° C. to about 190° C. for about 1 to about 24 hours.

Because the guide pattern 105 may not be thermally deformed at a temperature higher than 200° C., the structure of the guide pattern 105 may not be deformed, but maintained at the temperature range for phase separating the block copolymer layer 114.

Figure 2E:
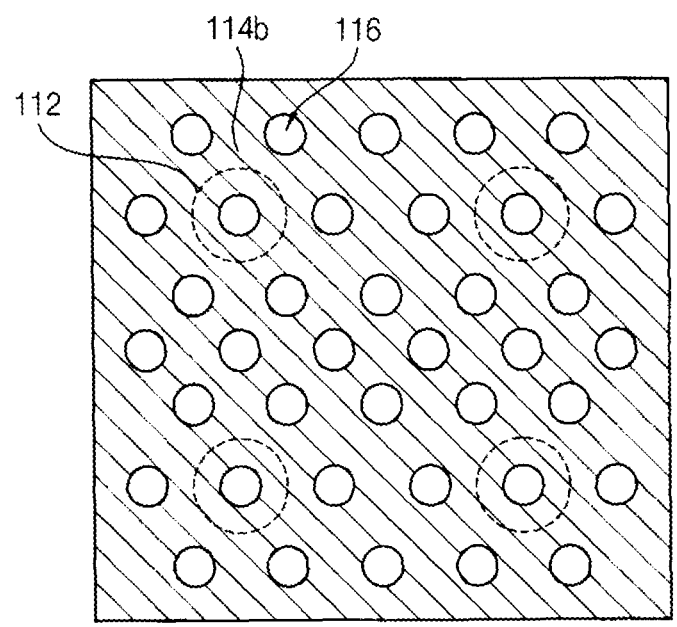

Referring to FIGS. 1H and 2E, a minute or reduced pattern mask 118 may be formed by removing one of the first polymer block and the second polymer block from the minute or reduced pattern layers 114a and 114b. In example embodiments, the first polymer block, the PMMA, may be removed. Accordingly, the minute or reduced pattern mask 118 including the second opening portion 116 having the contact hole shape may be formed by removing the first patterns 114a having the pillar shape. The minute or reduced pattern mask 118 may comprise the second polymer block, the PS.

In order to remove the first polymer block, for example, a method of exposing UV onto the first polymer block to be removed or a method of exposing to an oxygen plasma to photo degrade, and stripping the photo degraded portion, may be used.

Referring to FIG. 1I, the exposed portion of the guide layer 104 may be etched by using the minute or reduced pattern mask 118 as an etching mask to form a guide pattern 104a, and the object layer 102 to be etched may be etched to form a minute or reduced contact hole 120 and an object layer pattern 102a. When the object layer 102 to be etched is the substrate, the substrate 100 may be etched by using the minute or reduced pattern mask 118 as an etching mask to form the minute or reduced contact hole 120. The minute or reduced contact hole 120 may have substantially the same inner width as the second opening portion 116. In addition, the minute or reduced contact hole 120 may have a narrower width than the first opening portion 112.

The minute or reduced pattern mask 118 may be removed and unnecessary layers may be removed.

As described above, a minute or reduced contact hole having a minute or reduced inner width may be formed by using a silicon oxynitride layer as a guide layer and using a block copolymer. The silicon oxynitride layer may have a relatively high hydrophilicity and an improved thermal stability, and may be affordable. Thus, the silicon oxynitride layer may be appropriately used in a manufacturing process of a semiconductor device. By using the silicon oxynitride layer as the guide layer, the addressing property of a polymer block may be increased, and minute or reduced contact holes having a uniform inner width and arranged regularly and repeatedly may be formed.

FIGS. 3A to 3E are perspective views for explaining a method of forming line patterns in accordance with example embodiments. FIGS. 4A to 4E are plan views for explaining a method of forming line patterns in accordance with example embodiments.

In example embodiments, a minute or reduced pattern having a line and space shape may be formed. Because the minute or reduced pattern shape is different from that illustrated in FIGS. 1A to 1I, the shape of the guide pattern and the volume fraction of each polymer block of the block copolymer may be different from those illustrated in FIGS. 1A to 1I. The remaining particulars and processes are similar to the description of FIGS. 1A to 1I. Accordingly, an overlapping part of the explanation will be given in brief or omitted. In addition, because the cross-sectional views of the line pattern are the same as illustrated in FIGS. 1A to 1I, the cross-sectional views will be omitted.

Figure 3A:
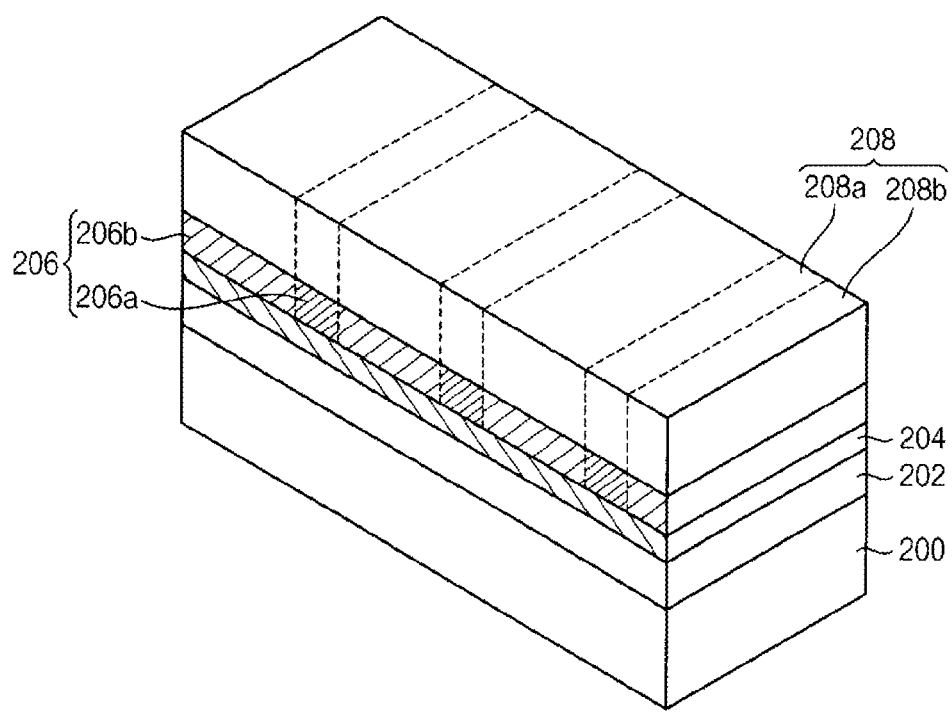
FIGS. 3A to 3E are perspective views for explaining a method of forming a line pattern in accordance with example embodiments.
Figure 4A:
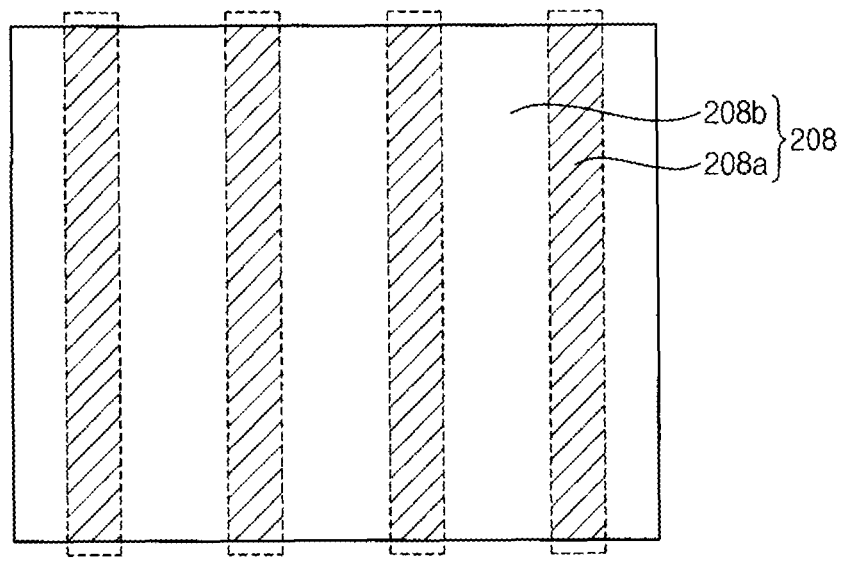
FIGS. 4A to 4E are plan views for explaining a method of forming a line pattern in accordance with example embodiments.

Referring to FIGS. 3A and 4A, an object layer 202 to be etched may be formed on a substrate 200. In example embodiments, because the line pattern may be formed, the object layer to be etched may be an insulating layer or a conductive layer. Particularly, the object layer 202 to be etched may be an oxide layer, a nitride layer, an oxynitride layer, a metal layer, a polysilicon layer or a substrate itself.

On the object layer 202 to be etched, a guide layer 204 may be formed. The guide layer 204 may comprise a silicon oxynitride layer having a relatively strong hydrophilicity. The silicon oxynitride layer may be formed by a chemical vapor deposition method. On the guide layer 204, a DBARC layer 206 may be formed. On the DBARC layer 206, a positive photoresist film 208 may be formed.

Then, a portion of the positive photoresist film 208 for forming a photoresist pattern may be exposed. After conducting the exposing process, the positive photoresist film 208 may be divided into an exposed portion 208a and an unexposed portion 208b.

The exposed portion may be a portion for exposing the underlying guide layer 204, and the exposed portion of the guide layer 204 may be provided as a guide pattern for forming a line pattern. In example embodiments, because a pattern having repeatedly formed line and space is required to be formed, the guide pattern may have a line shape. Accordingly, the exposed portion of the positive photoresist film 208 may have a line shape.

The light exposed while conducting the exposing process may be transferred to the DBARC layer 206 as well as the positive photoresist film 208. Accordingly, the DBARC layer 206 positioned under the positive photoresist film 208 of the exposed portion may also be exposed, and the DBARC layer 206 may be also divided into an exposed portion 206a and an unexposed portion 206b. The exposed portion 206a and the unexposed portion 206b of the DBARC layer 206 may have a different solubility to each other.

Figure 3B:
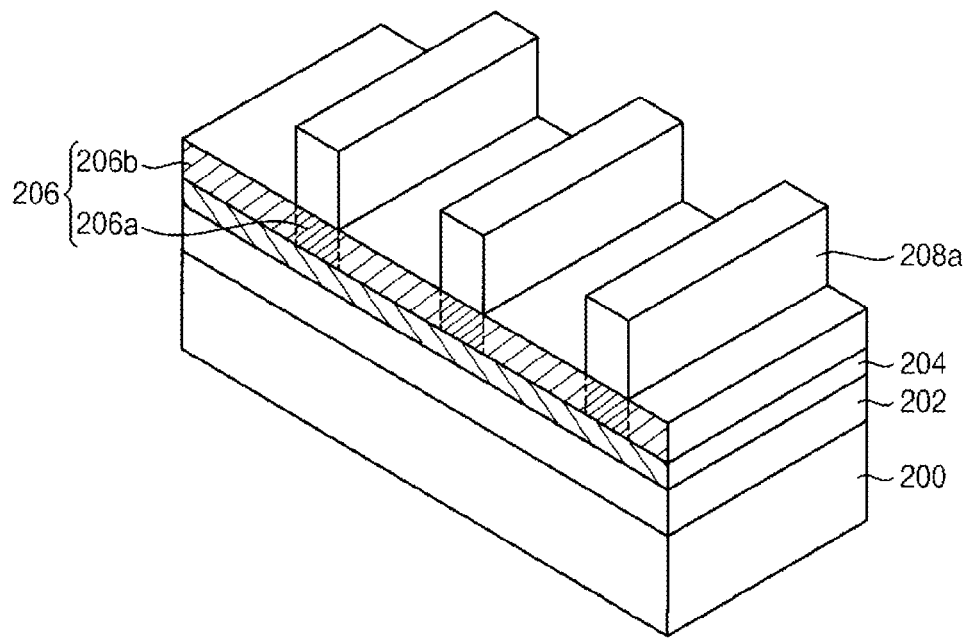
Figure 4B:
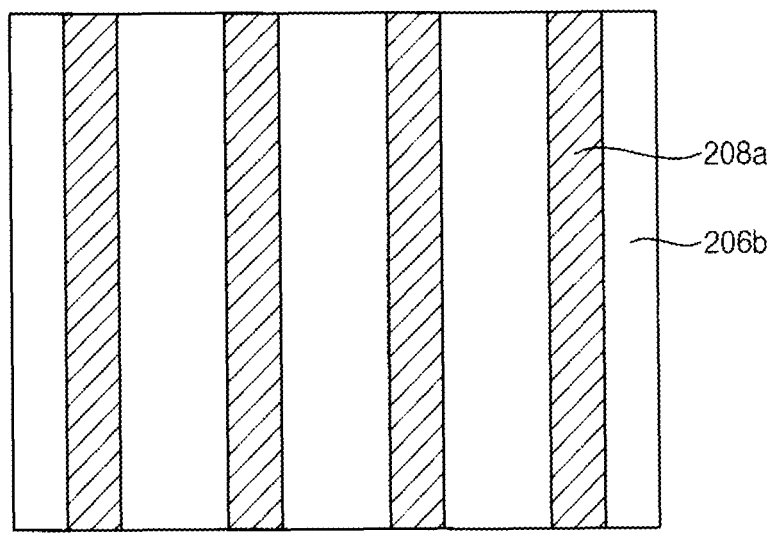

Referring to FIGS. 3B and 4B, the unexposed portion 208b of the positive photoresist film 208 may be removed. In order to remove the unexposed portion 208b of the positive photoresist film 208, an organic solvent of a negative tone developer may be used.

After removing the positive photoresist film 208 of the unexposed portion 208b, only the positive photoresist film 208 of the exposed portion 208a may remain to form a photoresist pattern 208a. The photoresist pattern 208a may have a line shape and may be repeatedly disposed. The photoresist pattern 208a may be baked at a temperature range of about 200° C. to about 250° C. to cure the photoresist pattern 208a.

Figure 3C:
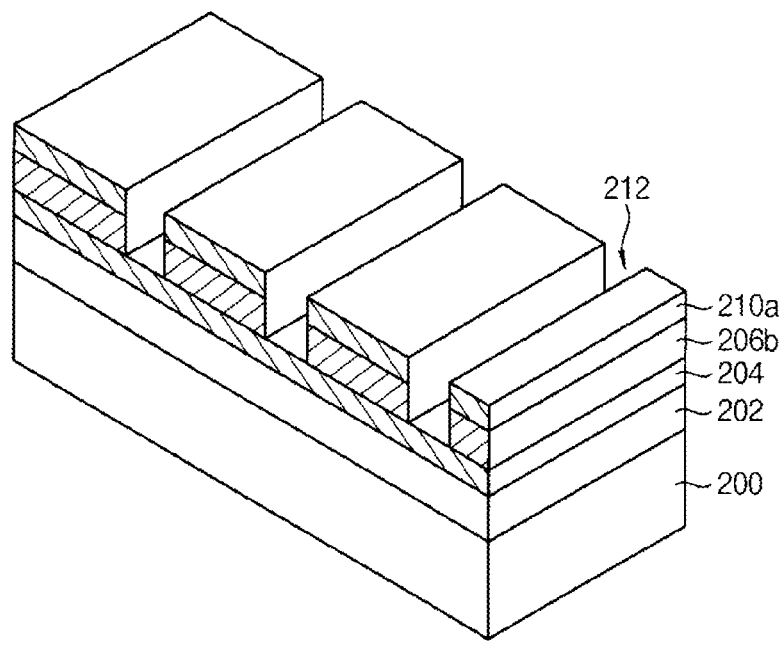
Figure 4C:
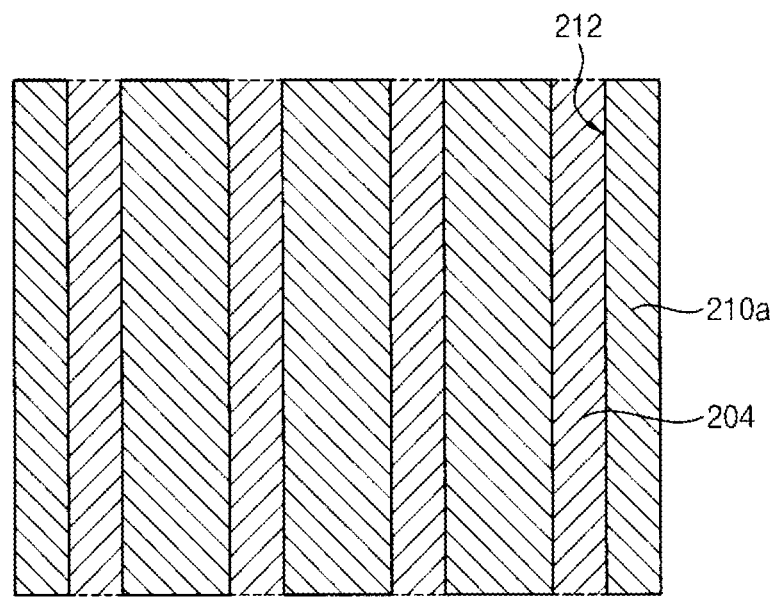

Referring to FIGS. 3C and 4C, a neutral layer (not illustrated) may be formed on the outer surface of the photoresist pattern 208a and the upper surface of the unexposed portion 206b of the DBARC layer. The neutral layer may be formed by using a material having the same affinity with respect to each block of a block copolymer to be formed in a following process. The neutral layer may be, for example, a random polymer.

The substrate 200 including the neutral layer formed thereon may be developed by using a developer to remove the photoresist pattern 208a and the exposed portion 206a of the DBARC layer disposed under the photoresist pattern 208a. The developer may be an aqueous alkaline solution, for example, an aqueous solution of TMAH.

After conducting the above described developing process, all of the photoresist pattern 208a may be removed, and only the exposed portion 206a of the DBARC layer 206 may be removed to form a DBARC pattern 206b. In addition, the neutral layer disposed at the upper surface and the sidewall of the photoresist pattern 208a may be lifted-off and removed. Accordingly, only the neutral layer disposed on the DBARC pattern 206b may remain to form a neutral layer pattern 210a.

First opening portions 212 having a line shape may be formed at the removed portion of the photoresist pattern 208a and the underlying DBARC pattern 206b. In addition, through the bottom surface of the first opening portion 202, the guide layer 204 may be exposed. The guide layer 204 at the exposed portion may be provided as a guide pattern while forming a pattern using a phase separation phenomenon of a block copolymer in a following process.

Figure 3D:
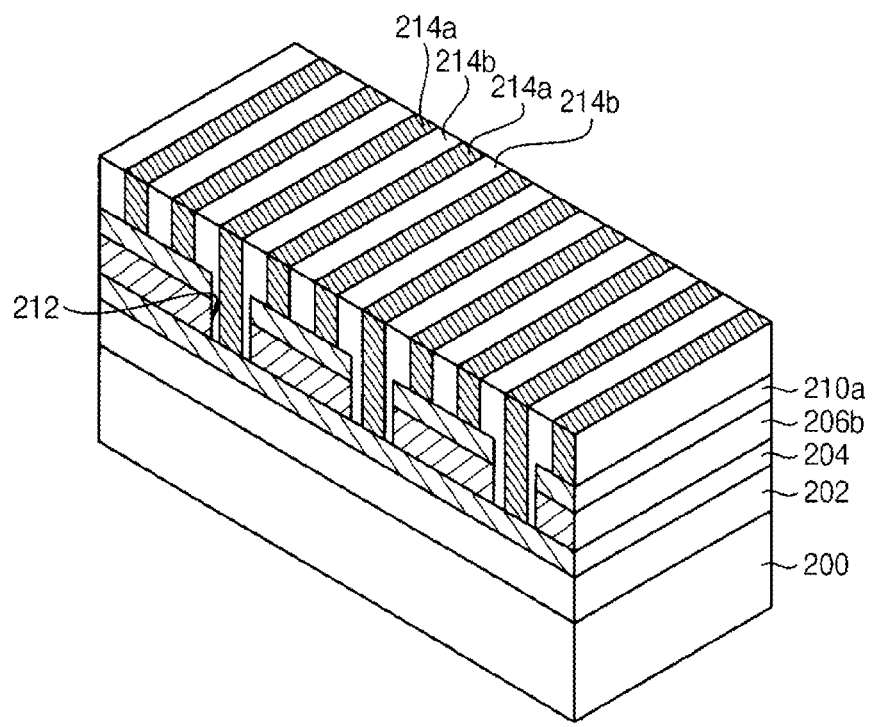
Figure 4D:
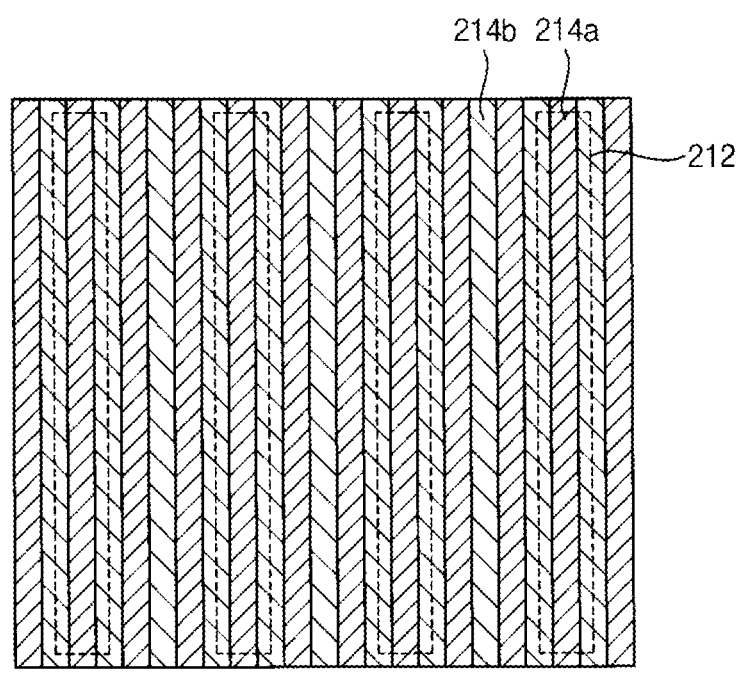

Referring to FIGS. 3D and 4D, a block copolymer layer may be formed on a structure including the first opening portion 212 and the neutral layer pattern 210a formed thereon.

The block copolymer layer may include a block copolymer including two polymer blocks (will be called as first and second polymer blocks, hereinafter). In example embodiments, the first polymer block may be relatively hydrophilic, and the second polymer block may be relatively hydrophobic.

According to the volume fraction of the first and second polymer blocks included in the block copolymer, the pattern shape formed in a following process may become different. In example embodiments, a line and space shape pattern may be formed in a following process and so, the first and second polymers may have the volume fraction to have a lamellar structure. To satisfy the condition, the block copolymer may include the first polymer block by the volume fraction of about 45 to about 55% and the second polymer block by the volume fraction of about 45 to about 55%. For example, the volume fraction ratio of the first polymer block:the second polymer may be 1:1.

The block copolymer used in example embodiments may include a polystyrene (PS)-polymethyl methacrylate (PMMA) block copolymer. In example embodiments, the PS domain may have the volume fraction of about 50% and the PMMA domain may have the volume fraction of about 50% in the PS-b-PMMA. The block copolymer may not be limited to the PS-b-PMMA, but may include other kinds of a diblock copolymer, a triblock copolymer or a multiblock copolymer.

Through the phase separation of the block copolymer layer, the components of the block copolymer layer may be rearranged to form minute or reduced pattern layers 214a and 214b including repeatedly formed lines. In order to conduct the phase separation, the block copolymer layer may be annealed at a temperature range of about 100° C. to about 190° C. for about 1 to about 24 hours.

In example embodiments, the PMMA of the first polymer block may be directed by the exposed portion of the guide layer to form a first pattern 214a having a line shape. In addition, the PS of the second polymer block adjacent to the directed first polymer block, may be self-assembled to form a second pattern 214b having a line shape. Accordingly, a minute or reduced pattern layer including repeatedly disposed first patterns 214a and second patterns 214b may be formed.

Figure 3E:
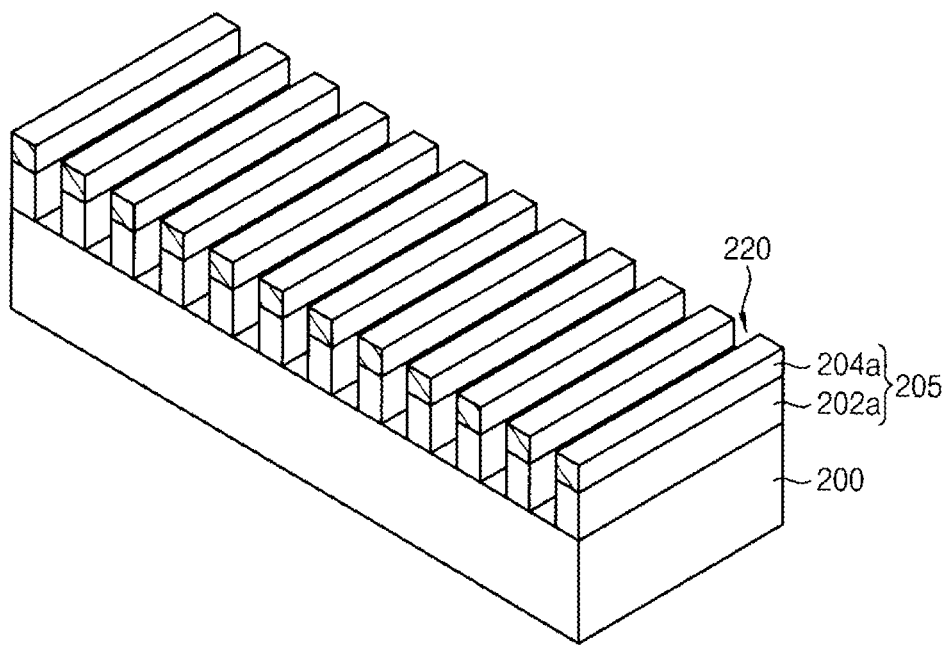
Figure 4E:
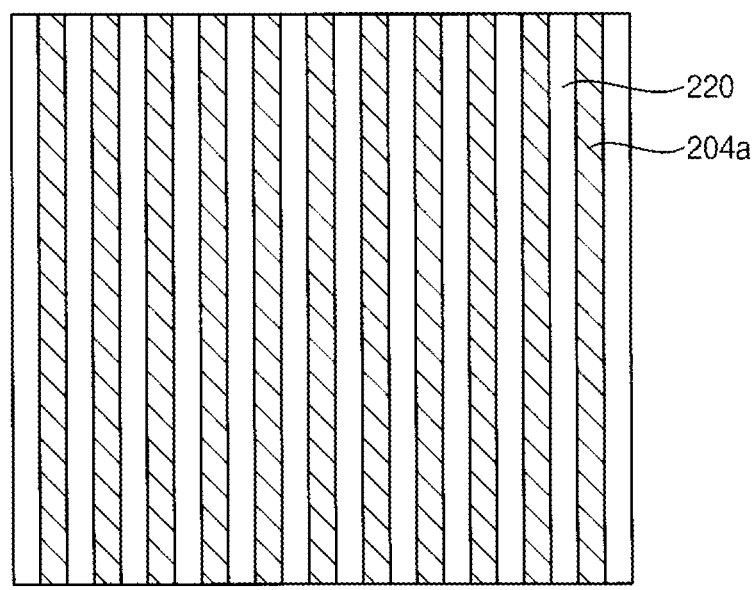

Referring to FIGS. 3E and 4E, by removing one of the first polymer block and the second polymer block from the minute or reduced pattern layers 214a and 214b, a minute or reduced pattern mask may be formed. Particularly, the first polymer block, the PMMA, may be removed.

The exposed portion of the guide layer 204 may be etched by using the minute or reduced pattern mask as an etching mask to form a guide pattern 204a, and the object layer 202 may be etched to form the guide pattern 204a and an object pattern 202a forming minute or reduced patterns 205 having a line and space shape. Between the minute or reduced patterns, a second opening portion 220 may be formed. When the object layer 202 to be etched is the substrate itself, the substrate 200 may be etched by using the minute or reduced pattern mask as the etching mask to form a pattern. The minute or reduced pattern mask may be removed, and unnecessary layers may be removed.

Through conducting the above-described processes, minute or reduced patterns having a line and space shape having a relatively narrow line width and distance beyond the limit of the exposing process may be formed.

Figure 5A:
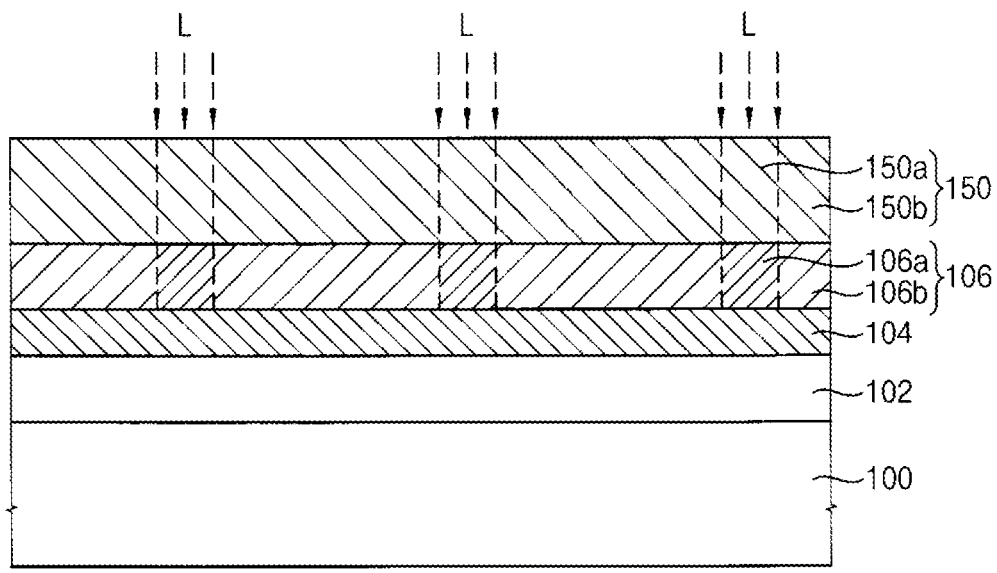
FIGS. 5A to 5C are cross-sectional views for explaining a method of forming a contact hole in accordance with example embodiments.
Figure 5B:
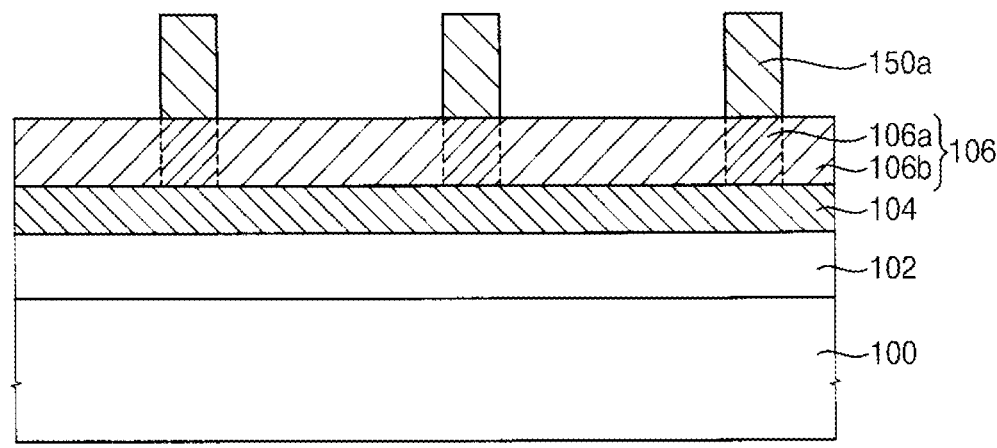
Figure 5C:
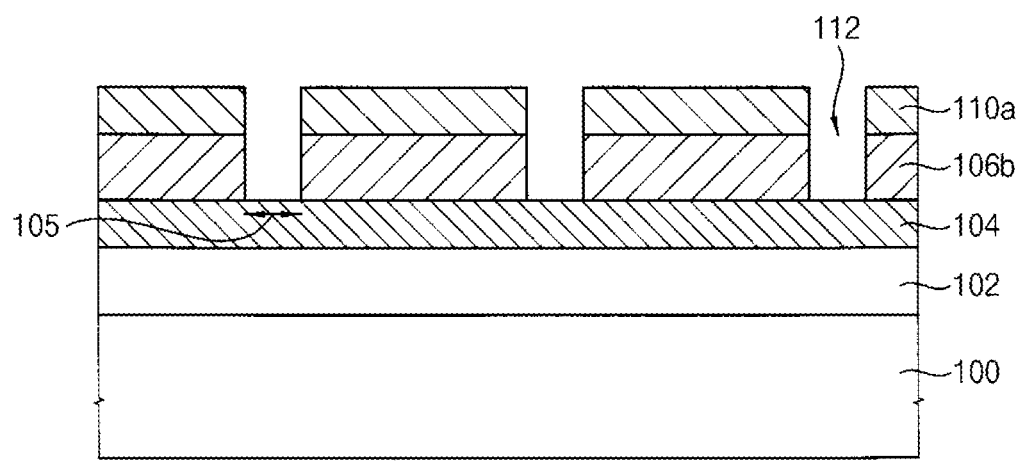

FIGS. 5A to 5C are cross-sectional views for explaining a method of forming contact holes in accordance with example embodiments.

Referring to FIG. 5A, an object layer 102 to be etched may be formed on a substrate 100. On the object layer 102 to be etched, a guide layer 104 may be formed. The guide layer 104 may comprise a silicon oxynitride layer having a relatively strong hydrophilicity. The silicon oxynitride layer may be formed by a chemical vapor deposition method. On the guide layer 104, a DBARC layer 106 may be formed.

On the DBARC layer, a negative photoresist film 150 may be formed. The negative photoresist film 150 may include a polymer which may be cross-linked by an acid and become insoluble in a developer, a photo acid generating agent and a solvent. Accordingly, the exposed portion of the negative photoresist film 150 may be hardened to form a pattern and the unexposed portion may be dissolved in the developer.

The photoresist included in the negative photoresist film 150 may include a resist for a KrF excimer laser (248 nm), a resist for an ArF excimer laser (193 nm), a resist for an F2 excimer laser (157 nm) or a resist for an extreme ultraviolet (EUV, 13.5 nm).

A portion of the negative photoresist film 150 for forming a photoresist pattern may be exposed. After performing the exposing process, the negative photoresist film 150 may be divided into an exposed portion 150a and an unexposed portion 150b. While performing the exposing process, the DBARC layer 106 underlying the negative photoresist film 150 in the exposed portion may also be exposed, and the DBARC layer 106 may be divided into an exposed portion 106a and an unexposed portion 106b.

The exposed portion may be a portion for exposing the underlying guide layer 104, and the exposed portion of the guide layer 104 may be provided as a guide pattern for forming a contact hole. In example embodiments, the upper surface of the guide pattern may have a circular shape. Thus, the exposed portion of the negative photoresist film 150 may have a circular shape.

Referring to FIG. 5B, the unexposed portion 150b of the negative photoresist film 150 may be removed by using a developer. The developer may be a material hardly dissolving the cross-linked polymer, but dissolving non-cross-linked polymer.

The developer may be an aqueous alkaline solution, for example, an aqueous solution of TMAH. The concentration of the aqueous TMAH solution may be, for example, about 2 to about 5 wt %.

By removing the negative photoresist film in the unexposed portion, only the negative photoresist film in the exposed portion may remain to form a photoresist pattern 150a. The photoresist pattern 150a may have a pillar shape. The photoresist pattern 150a may be cured by baking the photoresist pattern 150a at a temperature of 200° C. to 250° C.

Referring to FIG. 5C, a neutral layer (not illustrated) may be formed on the outer surface of the photoresist pattern 150a and on the upper surface of the exposed DBARC layer. The neutral layer may be formed by a material having the same affinity with respect to each block included in a block copolymer formed in a following process. The neutral layer may be formed by, for example, a random polymer.

The photoresist pattern 150a and the exposed portion 106a of the DBARC layer disposed under the photoresist pattern 150a may be removed. Because the photoresist pattern may include a non-cross-linked polymer, the photoresist pattern may not be removed by a developer. Accordingly, the photoresist pattern 150a and the exposed portion 106a of the DBARC layer may be removed by using a thinner composition for stripping of a photoresist material. The photoresist pattern 150a and the exposed portion 106a of the DBARC layer disposed under the photoresist pattern 150a may be removed by dipping the substrate into the thinner composition or by spraying the thinner composition onto the substrate by using a rotating chuck and a nozzle. While conducting the removing process, the unexposed portion 106b of the DBARC layer may be required to remain.

By other removing methods, most of the photoresist pattern 150a may be removed by using the thinner composition. Then, the exposed portion 106a of the DBARC layer may be removed by using the developer.

First opening portions 112 having a contact hole shape may be formed at the removed portion of the photoresist pattern 150a and the exposed portion of the DBARC layer 106a. In addition, through the bottom portion of the first opening 112, the guide layer 104 may be exposed. The exposed portion of the guide layer 104 may be provided as a guide pattern 105 while forming a pattern using a phase separation phenomenon of a block copolymer in a following process.

By conducting the above-described processes, the same structure as illustrated in FIG. 1E may be formed. Then, the same processes explained referring to FIGS. 1F to 1I may be conducted to form the same minute or reduced contact holes as illustrated in FIG. 1I.

As described above, a minute or reduced contact hole having a minute or reduced inner width may be formed by using the silicon oxynitride layer as the guide layer and using the block copolymer.

Figure 6A:
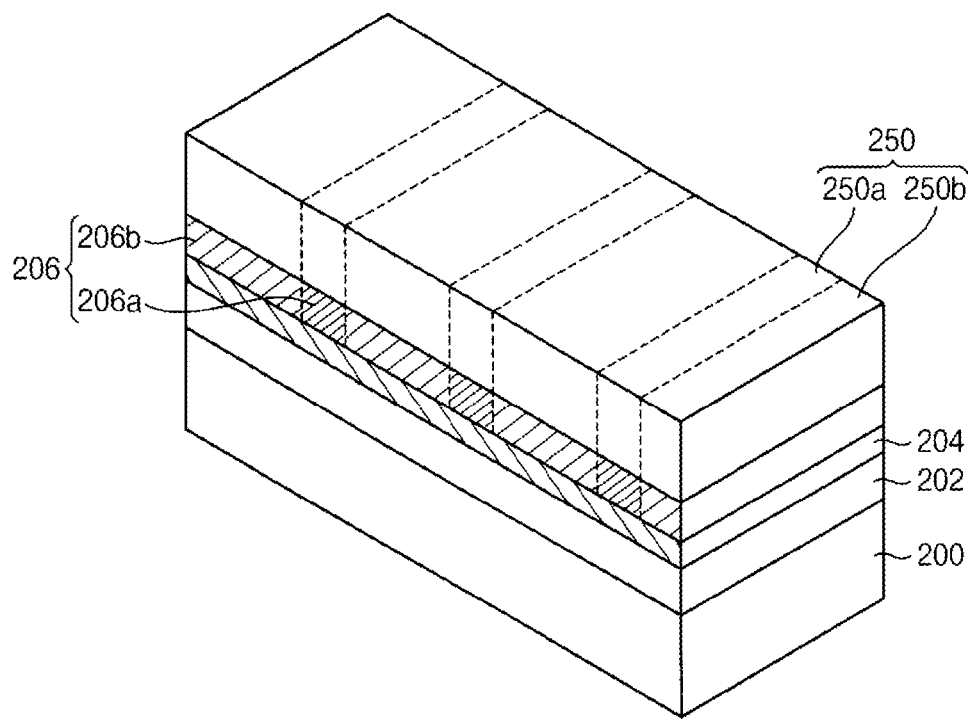
Figure 6B:
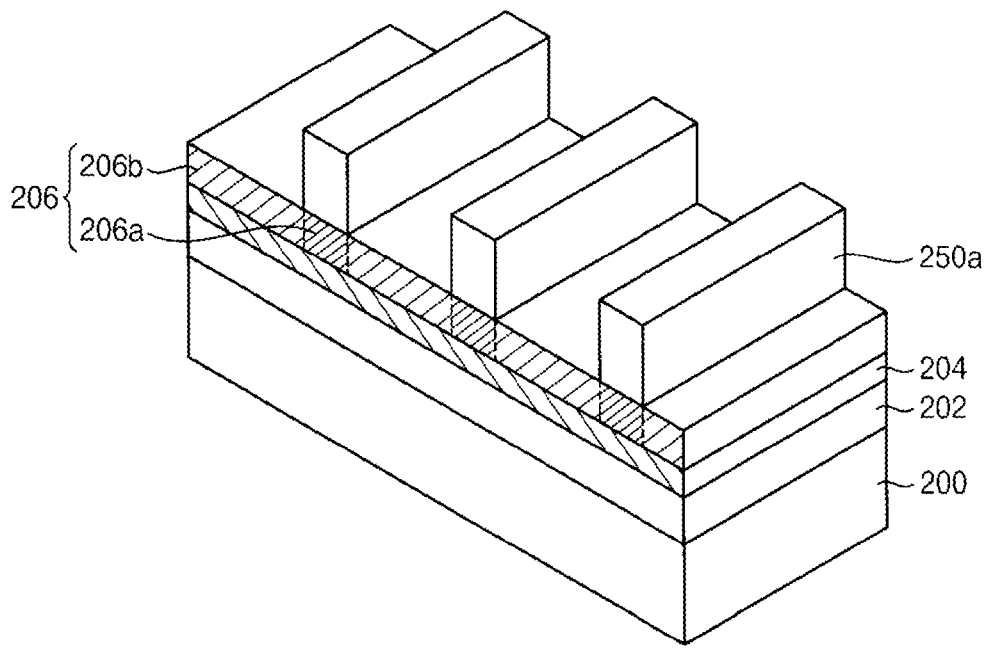
Figure 6C:
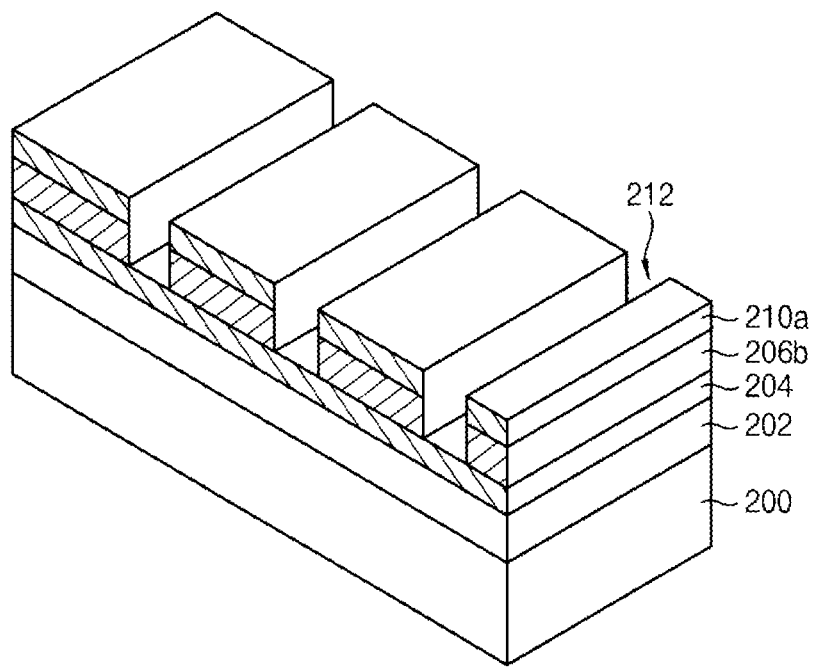

FIGS. 6A to 6C are perspective views for explaining a method of forming line patterns in accordance with example embodiments.

Referring to FIG. 6A, an object layer 202 to be etched may be formed on a substrate 200. On the object layer 202 to be etched, a guide layer 204 may be formed. The guide layer 204 may comprise a silicon oxynitride layer having a relatively strong hydrophilicity. The silicon oxynitride layer may be formed by a chemical vapor deposition method. On the guide layer 204, a DBARC layer 206 may be formed. On the DBARC layer 206, a negative photoresist film 250 may be formed.

Then, a portion of the negative photoresist film 250 for forming a photoresist pattern may be exposed. After performing the exposing process, the negative photoresist film 250 may be divided into an exposed portion 250a and an unexposed portion 250b. While performing the exposing process, the DBARC layer 206 underlying the exposed portion of the negative photoresist film 250 may also be exposed, and the DBARC layer 206 may be divided into an exposed portion 206a and an unexposed portion 206b.

The exposed portion may be a portion for exposing the underlying guide layer 204, and the exposed portion of the guide layer 204 may be provided as a guide pattern for forming a pattern having a line and space shape. In example embodiments, the upper surface of the guide pattern may have a line shape. Thus, the exposed portion of the negative photoresist film 250 may have a line shape.

Referring to FIG. 6B, the unexposed portion 250b of the negative photoresist film 250 may be removed by using a developer. By removing the unexposed portion of the negative photoresist film 250b, a photoresist pattern 250a having a line shape may be formed. The photoresist pattern 250a may have a line shape and may be repeatedly disposed. The photoresist pattern 250a may be cured by baking the photoresist pattern 250a at a temperature of 200° C. to 250° C.

Referring to FIG. 6C, a neutral layer (not illustrated) may be formed on the outer surface of the photoresist pattern 250a and the upper surface of the exposed DBARC layer 206. The neutral layer may be formed by a material having the same affinity with respect to each block included in a subsequently formed block copolymer. The neutral layer may be formed by, for example, a random polymer.

The photoresist pattern 250a and the exposed portion 206a of the DBARC layer disposed under the photoresist pattern 250a may be removed. The removing process may be conducted by using a thinner composition for stripping of a photoresist material. After removing most of the photoresist pattern by using the composition, the exposed portion 106a of the DBARC layer may be removed by the developer. While conducting the removing process, the unexposed portion 206b of the DBARC layer may be required to remain.

Through the above process, the neutral layer may be lifted-off to form a neutral layer pattern 210a. In addition, first openings 212 having a line shape may be formed at the removed portion of the photoresist pattern 250a and the underlying unexposed portion 206b of the DBARC layer. Through the bottom portion of the first opening 212, the guide layer 204 may be exposed. The guide layer 204 at the exposed portion may be provided as a guide pattern while forming a pattern by using a phase separation phenomenon of a block copolymer in a following process.

Through conducting the above-described processes, the same structure as illustrated in FIG. 3C may be formed. Then, in the same processes explained referring to FIGS. 3D and 3E, a line pattern having a minute or reduced line width as illustrated in FIG. 3E may be formed.

Example embodiments may be applied in a manufacturing process of a semiconductor device including ultra-minute or reduced patterns.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:

1. A method of forming a pattern, the method comprising:
   forming a hydrophilic guide layer on a substrate including an object layer formed thereon;
   forming a developable bottom anti-reflective coating (DBARC) layer and a photoresist film on the hydrophilic guide layer;
   exposing a portion of the photoresist film and the underlying DBARC layer to form an exposed portion and an unexposed portion in the photoresist film and the DBARC layer, respectively;
   forming a photoresist pattern including the exposed portion of the photoresist film by removing the photoresist film of the unexposed portion;
   forming a neutral layer on a surface of the photoresist pattern and the unexposed portion of the DBARC layer;
   removing the photoresist pattern, the neutral layer on a surface of the photoresist pattern, and the exposed portion of the DBARC layer to form a neutral layer pattern and first opening portions exposing a surface of the hydrophilic guide layer;
   forming a block copolymer layer on the neutral layer pattern and filling the first opening portions, the block copolymer layer including a block copolymer having a first polymer block and a second polymer block;

forming a pattern layer including first patterns and second patterns by microphase separating the block copolymer layer, each of the first patterns and each of the second patterns being repeatedly disposed, the first patterns including the first polymer block in the first opening portions and on the neutral layer, the second patterns including the second polymer block surrounding sidewalls of the first patterns;

forming a pattern mask by removing one of the first and second patterns including at least one of the first and second polymer blocks from the pattern layer; and forming a pattern by etching the object layer using the pattern mask, the pattern including second opening portions.

2. The method of claim 1, wherein the forming a hydrophilic guide layer forms a silicon oxynitride layer.

3. The method of claim 1, wherein the removing the photoresist pattern, the neutral layer on a surface of the photoresist pattern, and the exposed portion of the DBARC layer forms a guide pattern having an upper surface with a circular shape.

4. The method of claim 1, wherein the forming a pattern layer including first patterns and second patterns by microphase separating the block copolymer layer comprises:

annealing the block copolymer layer at a temperature higher than a glass transition temperature of the block copolymer; and forming the first patterns to be in contact with the hydrophilic guide layer exposed through the first opening portions, wherein each of the first patterns and each of the second patterns are repeatedly formed in the first opening portions and on the neutral layer pattern, respectively, by being directed by the first patterns making contact with the exposed hydrophilic guide layer.

5. The method of claim 1, wherein an inner width of the first opening portions is greater than an inner width of the second opening portions, and an interval between the first opening portions is greater than or equal to the inner width of the first opening portions.

6. The method of claim 1, wherein the first opening portions have a contact hole shape and the first patterns have a pillar shape, the first patterns being formed regularly.

7. The method of claim 6, wherein the first polymer block is hydrophilic, the second polymer block includes a hydrophobic material, a volume fraction of the first polymer block in the block copolymer layer is about 20 to about 40%, and a volume fraction of the second polymer block in the block copolymer layer is about 60 to about 80%.

8. The method of claim 6, wherein the forming a pattern mask includes removing the first patterns including the first polymer block.

9. The method of claim 1, wherein the forming a block copolymer layer includes forming a polystyrene-polymethyl methacrylate block copolymer (PS-b-PMMA).

10. The method of claim 1, wherein the forming a photoresist film includes forming a positive photoresist film, further comprising:

removing the unexposed portion of the photoresist film using a negative tone developer.

11. The method of claim 10, wherein the photoresist pattern, the neutral layer on a surface of the photoresist pattern, and the exposed portion of the DBARC layer are removed using a tetramethyl ammonium hydroxide (TMAH) developer.

12. The method of claim 1, wherein the forming a photoresist film includes forming a negative photoresist film, further comprising:

removing the unexposed portion of the photoresist film using a TMAH developer.

13. The method of claim 12, wherein the photoresist pattern and the DBARC layer of the exposed portion are removed using a thinner composition.

14. The method of claim 1, wherein the first opening portions have a line shape, and the first patterns and the second patterns have a line shape and are alternately and regularly formed.

15. The method of claim 14, wherein the first polymer block is hydrophilic, the second polymer block includes a hydrophobic material, a volume fraction of the first polymer block in the block copolymer layer is about 45 to about 55%, and a volume fraction of the second polymer block in the block copolymer layer is about 45 to about 55%.

16. A method comprising:

forming a guide layer on a substrate including an object layer formed thereon;

forming a developable bottom anti-reflective coating (DBARC) layer on the guide layer;

forming a photoresist film on the DBARC layer, exposing a portion of the photoresist film and the DBARC ver to form a photoresist pattern and an exposed portion of the DBARC layer, the photoresist pattern being on an exposed portion of the DBARC layer;

removing the photoresist pattern and the exposed portion of the DBARC layer to form first opening portions exposing a surface of the guide layer;

forming a block copolymer layer filling the first opening portions, the block copolymer layer including a block copolymer having a first polymer block and a second polymer block; and forming a pattern layer including first patterns and second patterns by microphase separating the block copolymer layer, each of the first patterns and each of the second patterns being repeatedly disposed, the first patterns including the first polymer block in the first opening portions, the second patterns including the second polymer block surrounding sidewalls of the first patterns.

17. The method of claim 16, further comprising:

forming a pattern mask by removing one of the first and second patterns including at least one of the first and second polymer blocks from the pattern layer; and forming a pattern by etching the object layer using the pattern mask, the pattern including second opening portions.

18. The method of claim 16, wherein the forming a guide layer forms a silicon oxynitride layer.

19. The method of claim 16, wherein the removing the photoresist pattern forms a guide pattern having an upper surface with a circular shape.

20. The method of claim 16, wherein the forming a block copolymer layer includes forming a polystyrene-polymethyl methacrylate block copolymer (PS-b-PMMA).

* * * * *